United States Patent
Pereira et al.

(10) Patent No.: US 9,143,146 B1
(45) Date of Patent: Sep. 22, 2015

(54) RECONFIGURABLE WIDEBAND SUB-RANGING ANALOG-TO-DIGITAL CONVERTER

(71) Applicant: Lockheed Martin Corporation, Bethesda, MD (US)

(72) Inventors: Victoria Tabuena Pereira, Moorestown, NJ (US); Lloyd Frederick Linder, Agoura Hills, CA (US); Douglas A. Robl, Philadelphia, PA (US); Brandon R. Davis, Mount Laurel, NJ (US); Toshi Omori, Manlius, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/479,946

(22) Filed: Sep. 8, 2014

(51) Int. Cl.
H03M 1/12 (2006.01)
H03M 1/08 (2006.01)
H03M 1/68 (2006.01)

(52) U.S. Cl.
CPC ............... *H03M 1/08* (2013.01); *H03M 1/121* (2013.01); *H03M 1/124* (2013.01); *H03M 1/68* (2013.01)

(58) Field of Classification Search
CPC ............ H03M 1/1215; H03M 1/1225; H03M 1/1245; H03M 1/12; H03M 1/167; H03M 1/468; H03M 1/1205; H03M 1/38; H03M 1/002; H03M 1/662
USPC ..................... 341/122, 141, 155, 161, 16, 162
See application file for complete search history.

(56) References Cited

U.S. PATENT DOCUMENTS

| | | | | | |
|---|---|---|---|---|---|
| 4,677,422 | A | * | 6/1987 | Naito | 341/122 |
| 4,893,124 | A | * | 1/1990 | Tsuji et al. | 341/156 |
| 6,094,153 | A | * | 7/2000 | Rumsey et al. | 341/155 |
| 6,693,573 | B1 | | 2/2004 | Linder | |
| 6,803,873 | B1 | * | 10/2004 | Motomatsu | 341/161 |
| 7,221,191 | B2 | * | 5/2007 | Ali et al. | 327/94 |
| 7,990,185 | B2 | | 8/2011 | Tran et al. | |
| 8,085,079 | B2 | | 12/2011 | Tran et al. | |
| 2002/0014982 | A1 | * | 2/2002 | Jonsson | 341/120 |
| 2004/0036453 | A1 | * | 2/2004 | Rossi | 323/242 |
| 2005/0219101 | A1 | * | 10/2005 | Kurose et al. | 341/155 |
| 2010/0060494 | A1 | * | 3/2010 | Pedersen | 341/110 |
| 2010/0103009 | A1 | * | 4/2010 | Imai | 341/122 |
| 2010/0117879 | A1 | * | 5/2010 | Ozeki et al. | 341/122 |
| 2011/0187573 | A1 | * | 8/2011 | Thomas et al. | 341/155 |

(Continued)

OTHER PUBLICATIONS

Willy Sansen, "CMOS ADC & DAC Principles", KULeuven, ESAT-MICAS, Leuven, Belgium, 65 pages, Oct. 2005.

*Primary Examiner* — Linh Nguyen

(74) *Attorney, Agent, or Firm* — Howard IP Law Group, PC

(57) ABSTRACT

A reconfigurable wideband analog-to-digital converter (ADC) system comprising a first converter stage having a first signal path including a first sample and hold circuit for sampling an input signal at a first resolution, and a second signal path responsive to the input signal and arranged in parallel with the first signal path. The second signal path includes a second sample and hold circuit for sampling the input signal at a second resolution. A first ADC is also included for generating a digital representation of the input signal sampled by the first converter stage. A control processor is arranged between outputs of the first and second sample and hold circuits and the input of the ADC for selectively providing the signal sampled by one of the first or second sample and hold circuit to the input of the ADC.

20 Claims, 14 Drawing Sheets

(56) References Cited

U.S. PATENT DOCUMENTS

2012/0249348 A1* 10/2012 Siragusa .................... 341/110
2012/0286986 A1* 11/2012 Noguchi .................... 341/155
2013/0234870 A1* 9/2013 Hague et al. ................ 341/110

* cited by examiner

RECONFIGURABLE WIDEBAND SUB-RANGING ANALOG-TO-DIGITAL CONVERTER

FIELD OF THE INVENTION

The present disclosure relates generally to analog to digital converters.

BACKGROUND

An analog-to-digital converter (A/D or ADC) is an electronic device that can convert analog signal information (e.g. amplitude or phase) to a digital (e.g. numerical) value representative of the analog signal. These devices enable a central processing unit to carry out processing functions in a more quantized mathematical domain without the need for downstream analog devices.

Signal processing systems utilizing A/D converters, including complex A/D converters (CADCs), have various functionality requirements. Such requirements may include a track and hold, or sample and hold operation performed on an analog input signal, as well as precise timing operations, in addition to the A/D conversion process. Clock generators, for example, are used to synchronize sample and hold amplifiers with an ADC. The sample and hold amplifiers follow an input analog signal of interest until a control signal from the clock causes the amplifier to freeze and hold the time varying analog signal (for a given time interval). The same clock signal also strobes the ADC to convert the held or "frozen" sample to a digital value. This digital data can then be buffered and read out to memory for further processing. The time it takes for the sample and hold amplifiers and ADC to perform the operation and be ready for the next value is the A/D sample rate.

Standard A/D conversion systems are too slow to directly digitize ultra high frequency and microwave RF signals. These frequency ranges are typically in the second and third Nyquist regions of the converter, including military frequency bands up to 20-40 GHz. Accordingly, these systems must utilize several analog down conversion steps before the signal is sufficiently low in frequency to allow for digitization. In addition to limited or low sample rates, A/D converters further hinder signal processing operations due to their limited resolution, measured by the effective number of bits or ENOB. In order to improve ADC resolution, various architectures including pipeline ADCs have been developed. Digitally programmable ADCs have been developed to support certain processing requirements such as multi-band and multi-mode operation. One such example is a digitally programmable sub-ranging ADC, which incorporates the improved resolution of pipeline-based architectures with the ability to operate in various modes (e.g. 5 bit, 9 bit and 13 bit). However, these systems typically incorporate analog multiplexers MUXs in a primary analog signal path of sub-ranging ADC system in order to reconfigure the system for different operating resolutions. A drawback of this approach is that these MUXs must possess a dynamic range greater than or equal to that of the converter as a whole. Further, because the MUXs are always in the primary signal path, they will necessarily add noise, and degrade the noise, settling, and dynamic range of the converter.

Alternative converter topologies are desired which accommodate multi-band and multi-mode operation, in addition to being digitally programmable, and preferably without one or more of the above-described limitations.

SUMMARY

In one embodiment, a reconfigurable wideband analog-to-digital converter (ADC) system is provided. The system comprises a first converter stage having a first signal path including a first sample and hold circuit for sampling an input signal at a first resolution, and a second signal path responsive to the input signal and arranged in parallel with the first signal path. The second signal path includes a second sample and hold circuit for sampling the input signal at a second resolution. A first ADC is also included for generating a digital representation of the signal sampled by the first converter stage. A control circuit is arranged between the first and second sample and hold circuits and the input of the ADC for selectively providing the signal sampled by one of the first or second sample and hold circuit to the input of the ADC.

In another embodiment, a reconfigurable ADC system comprises: 1) a first converter stage including a first sample and hold circuit for sampling an input signal at a first resolution and a second sample and hold circuit arranged in parallel with the first sample and hold circuit for sampling the input signal at a second resolution; 2) a second converter stage including a third sample and hold circuit arranged in series with the first converter stage; and 3) a third converter stage including a fourth sample and hold circuit arranged in series with the first and second converter stages. A control circuit is arranged in parallel with a primary signal path defined between an input of the first converter stage and an output of the third converter stage, and configured to selectively provide an output of the first or second sample and hold circuit to the input of an ADC.

BRIEF DESCRIPTION OF THE DRAWINGS

FIG. 4b is a section view of a portion of the digitally programmable sub-ranging ADC of FIG. 4a.

FIG. 8b is a simplified diagram of a reconfigurable ADC and DAC used in the sub-ranging ADC of FIG. 8a.

DETAILED DESCRIPTION OF PREFERRED EMBODIMENTS

Figure 1:
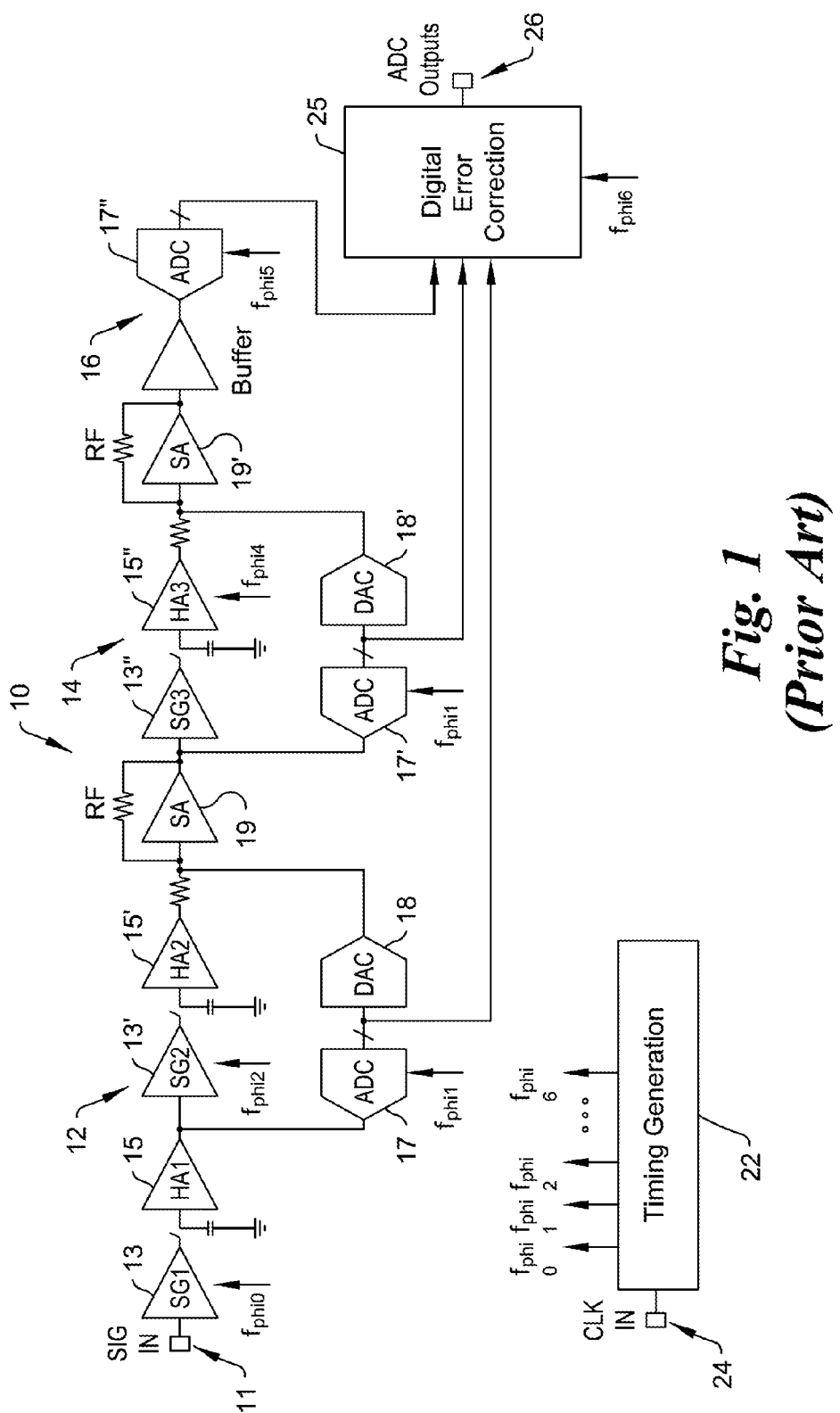
FIG. 1 is a simplified schematic diagram of a sub-ranging ADC according to the prior art.

It is to be understood that the figures and descriptions of the present invention have been simplified to illustrate elements that are relevant for a clear understanding of the present invention, while eliminating, for purposes of clarity, many other elements found in ADCs and their associated clock generation systems, including digitally programmable sub-ranging ADCs. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include improved ADC architectures that support multiple operational bandwidths as well as multiple modes of operation. This ADC architecture is based on sub-ranging ADC architectures, which have historically addressed both narrowband, high dynamic range applications for radar, as well as moderate bandwidth for communications applications.

FIG. 1 shows a simplified diagram of an exemplary sub-ranging ADC system 10 according to the prior art with three (3) sampling passes: first pass (coarse) 12, second pass (fine) 14, and third pass (superfine) 16. The ADC operates in a conventional way, with an analog input signal 11 sampled and held by a sample and hold circuit comprising a first buffer amplifier 13 and a first hold amplifier 15, while a first ADC 17 quantizes a first number of bits. The output of ADC 17 is provided to a first digital-to-analog converter (DAC) 18. The analog output of DAC 18 is subtracted from the output of a second sample and hold circuit, including a second buffer amplifier 13' and second hold amplifier 15' via amplifier 19. The resulting signal is provided to a third sample and hold circuit of second pass 14, comprising a third buffer amplifier 13" and a third hold amplifier 15". Second sampling pass 14 further includes a second ADC 17' and DAC 18'. The output of DAC 18' is again subtracted from the input signal via amplifier 19', and buffered to a third ADC 17" which constitutes third pass or stage 16 of ADC system 10. When a stage finishes processing a sample, determining bits, and passing the residue to the next stage, processing the next sample received from the sample-and-hold embedded within each stage may begin.

A timing generation system 22 is responsive to an input clock signal 24 for generating various delayed versions of the input clock signal, embodied as clock signals $f_{phi0}$-$f_{phi6}$. As illustrated, these clock signals are used to control the operation of, and more specifically the on/off timing of, the components of ADC system 10, including buffer and hold amplifiers 13-15" and ADCs 17-17'". Bits sampled from each ADC 17,17',17" from each stage are provided to digital error correction components such as digital error correction processor 25 for generating a digital output signal 26 representative of input signal 11. As the bits from each ADC 17-17"" are generated at different times during the conversion process, processor 25 time-aligns all of the bits by delaying the bits of ADC 17 and ADC 17' such that they align with bits generated by ADC 17" in time. Processor 25 is configured to digitally add all of the bits, and output a digital representation of sampled and held input signal 11, which is accomplished at the output of buffer amplifier 13.

Figure 2:
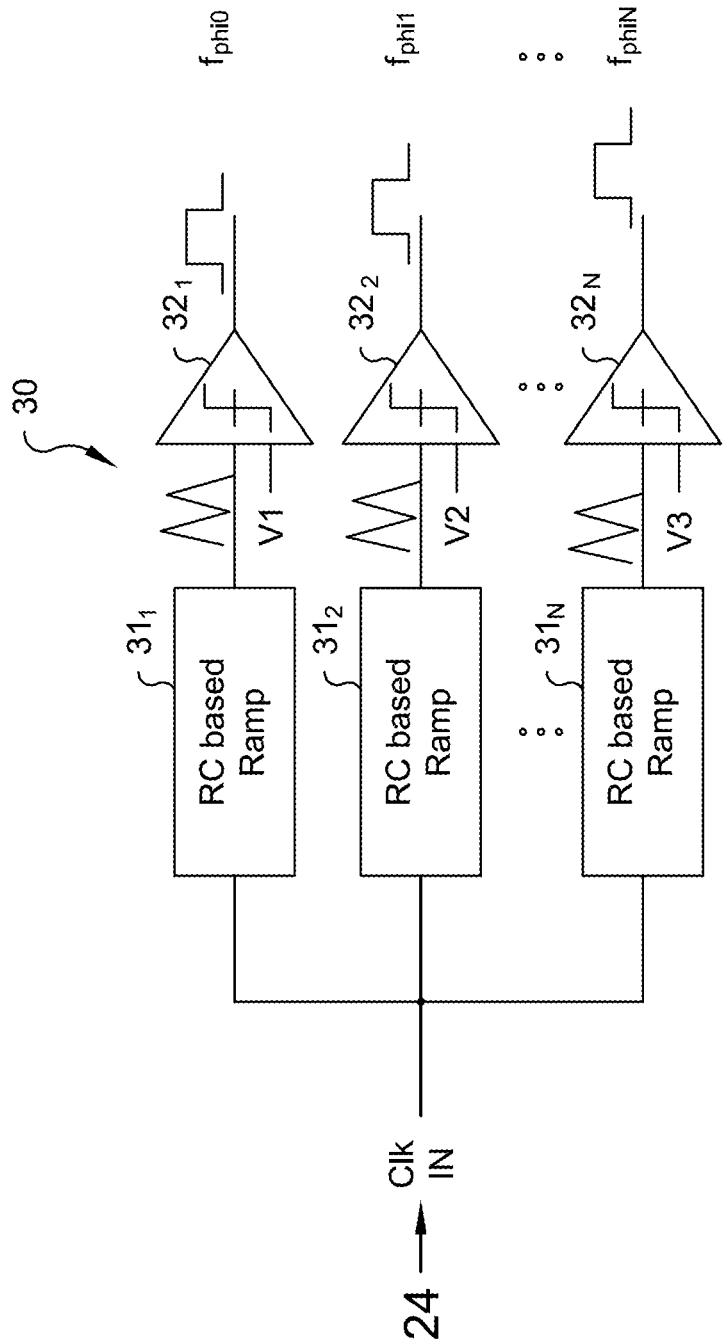
FIG. 2 is a simplified schematic diagram illustrating a clock generation scheme for the sub-ranging ADC of FIG. 1.

Traditional ADC clocking schemes used to generate, for example, the delayed clock signals $f_{phi0}$-$f_{phi6}$ illustrated in FIG. 1, utilize ramp-based timing in an open-loop architecture. As described above, these arrangements do not accurately track, and tend to generate high noise. For example, FIG. 2 illustrates a timing generation system 30 comprising a plurality of resistor-capacitor (RC) ramp timing generators $31_1, 31_2, 31_N$ and associated squaring amplifiers $32_1, 32_2, 32_N$ responsive to an input clock signal 24 for generating clock signals $f_{phi0}$-$f_{phi6}$. This RC-based timing generator approach is typically implemented into the above-described sub-ranging ADCs, and takes advantage of varying RC time constants to generate the desired clock delays. In addition to generating noise, this approach is limited to narrow bandwidths, and does not tolerate the wide bandwidth sampling operations required in today's more-advanced ADC applications.

Figure 3:
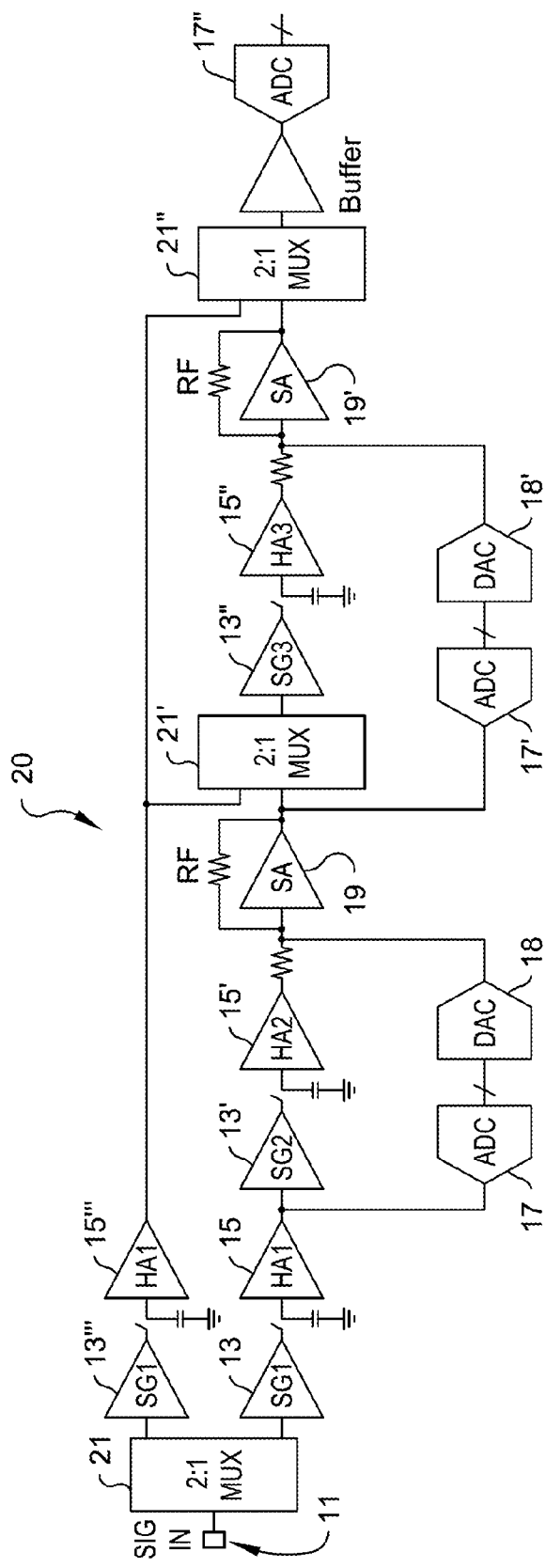
FIG. 3 is a simplified schematic diagram of a digitally programmable sub-ranging ADC according to the prior art.

ADC applications, including those used in communications, electronic warfare, and radar systems, have diverse instantaneous bandwidth, resolution, dynamic range, and signal-to-noise requirements. FIG. 3 illustrates a variation of the baseline sub-ranging ADC of FIG. 1, with like numerals identifying like components, optimized for addressing these multi-resolution and multi-bandwidth applications. In the illustrated approach, analog multiplexers (MUXs) 21,21',21" are placed in the primary analog signal path of sub-ranging ADC system 20 (i.e. between an input signal 11, through each buffer and hold amplifier 13-15", to the final ADC 17") in order to reconfigure the system for different operating resolutions. For example, if each ADC 17,17',17" is configured for five (5) bits resolution, with one (1) bit of overlap, the input signal can forego the first two of the passes and only drive the final five (5) bit ADC 17" directly via a single sample and hold circuit comprising buffer amplifier 13'" and hold amplified 15'", as well as MUXs 21,21". Alternatively, the input signal can be multiplexed by MUX 21' in the second pass so as to achieve nine bits of resolution, with 1 bit of overlap. Moreover, the input signal can be processed via the primary signal path, utilizing each of the three sampling passes as described above, in order to create a 13-14 bit ADC.

A drawback of this approach is that MUXs 21,21',21" are arranged directly in the critical primary signal path of ADC system 20. For example, at least at the front end of ADC system 20, MUX 21 must possess a dynamic range greater than or equal to that of the converter as a whole. Further, because MUXs 21,21',21" are always in the primary signal path, they will, by default, add noise, and degrade the noise, settling, and dynamic range of the converter, in comparison to the nominal converter shown in FIG. 1. Improved converter structures must address these issues and accommodate multi-band and multi-mode operation, in addition to being digitally programmable, without the above-described limitations.

Figure 4A:
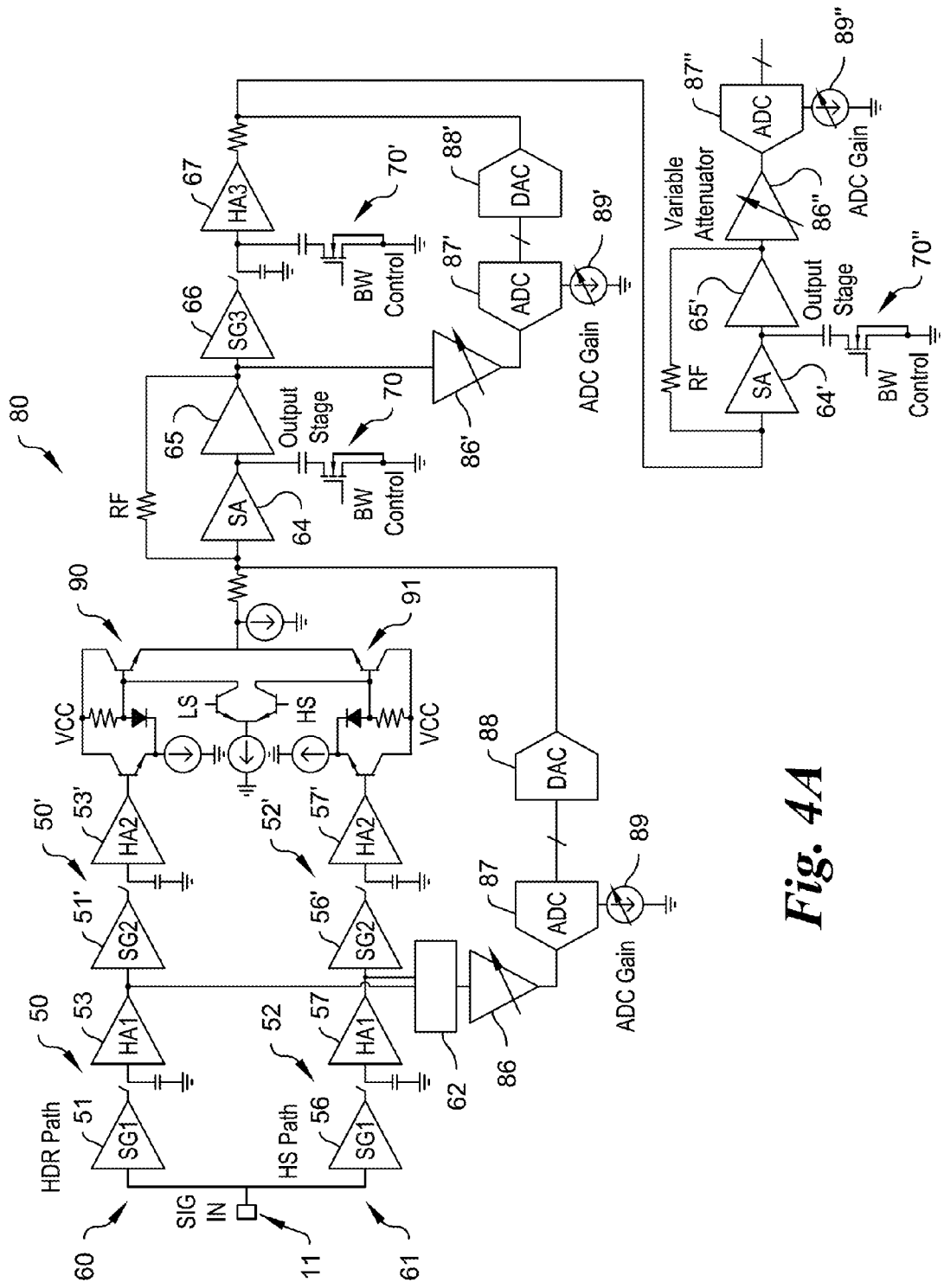
FIG. 4a is a simplified schematic diagram of a digitally programmable sub-ranging ADC according to embodiments of the present disclosure.

Using the base-line architecture of sub-ranging ADC system 10 of FIG. 1, improved ADCs are realized which maintain digital programmability for multi-band, multi-mode operation, without the above-described drawbacks of sub-ranging ADC system 20 shown and described in FIG. 3. Referring generally to FIG. 4a, a block diagram of a digitally reconfigurable ADC system 80 according to an embodiment of the present disclosure is shown. The illustrated ADC architecture places the required multiplexing functions in non-critical signal paths of the ADC. This results in a reduction/minimization of the impact on performance for any mode of operation, while simultaneously providing the functionality needed to allow for a single ADC to be reused, through digital reconfiguration, for very diverse signal conditions. The ADC is digitally controlled and offers programmable or modifiable clock rates, DC power, bandwidth, resolution, noise, linearity and distortion, as well as providing for digital calibration and compensation of ADC gain and offset errors. This approach supports moderate dynamic ranges at wide instantaneous bandwidths, as well as high dynamic range at narrow bandwidths.

Sub-ranging ADC system 80 is configured to support multi-band, multi-mode operation. For example, the ADC clock rate is variable in order to support nearly two decades of instantaneous bandwidth requirements (e.g. 50 MHz to 1 GHz). However, it is difficult to digitally reconfigure a single front end sample and hold circuit for the ADC without compromising the performance of the sample and hold in any mode of operation. In one embodiment, the front end of ADC system 80 is configured for processing along two signal paths: a high dynamic range (HDR) or high resolution path 60 and high speed path 61. High resolution signal path 60 comprises first and second sample and hold circuits 50,50', including respective first sample and hold amplifier pair 51,53 and second sample and hold amplifier pair 51',53'. Likewise, high speed path 61 comprises first and second sample and hold circuits 52,52', including respective first sample and hold amplifier pair 56,57 and second sample and hold amplifier pair 56',57'. Each path is communicatively coupled to analog input signal 11. In this way, each of paths 60,61 may be independently configured and optimized for performance according to the requirements of the particular application.

Sub-ranging ADC system 80 is further configured to enable changing the digital resolution of the converter without sacrificing performance through the use of MUXs arranged in the critical signal path. Due to the separate high resolution path 60 and high speed path 61, respective first sample and hold circuits 50,52, of each of these signal paths remain separate. Depending on which configuration ADC system 80 is operating (e.g. high speed or high resolution), the output of one of these first sample and hold circuits will be selectively passed to a coarse quantizer comprising ADC 87 and DAC 88 via control circuit 62 for performing the first sampling pass. The placement of control circuit 62 in this coarse path, as opposed to the main signal path of ADC system 80 (e.g. between input signal 11, through each sample and hold circuit, to a last ADC 87"), relaxes the performance requirements of control circuit 62, thus enabling its implementation without compromising overall performance. In order for first sampling pass to accommodate different possible resolutions, the signal to ADC 87 is controlled through a digitally programmable variable attenuator 86. Additionally, the gain of ADC 87 (e.g. Q level) is digitally programmable via gain control 89. These two adjustments provide two degrees to freedom, allowing the resolution of the ADC to grow or shrink without requiring circuit modifications.

Referring again to the main signal path of ADC system 80, in order to select high speed path 61 or high resolution path 60, a second multiplexing operation is required. However, this multiplexing is accomplished via a control circuit, including two selectively active emitter follower paths 90,91, rather than by placing an additional MUX in the primary signal path as described above with respect to FIG. 3. This approach mitigates the noise and distortion that would result from the addition a MUX in the primary signal path, and enables increased ADC performance. As illustrated in greater detail in FIG. 4b, a control circuit, including parallel emitter follower transformer arrangements, is utilized to select between signals paths 60,61. In operation, the control circuit acts equivalently to a MUX or a sample/hold circuit. For selection of high speed path 61, an HS control signal is configured as being at a low operational level (e.g. low or "off" state) while an LS control signal is configured in a high operational state (high or "on" state). For the selection of the high resolution path 60 the reverse is true. Whichever side of the illustrated differential pair is high, a current flows into the associated resistive loads R1,R1', and pulls the associated node low, thereby causing the base of the associated emitter follower paths 90,91 to transition to a low state. Thus, the associated transistor Q3,Q4 will be low (off), and the other emitter follower transistor Q3,Q4 will be on (high), and the associated signal path will be on (high). The unselected signal path is off or effectively blocked, thereby providing high isolation and low parasitic loss, so as not to compromise the settling performance of the signal path.

Figure 4B:
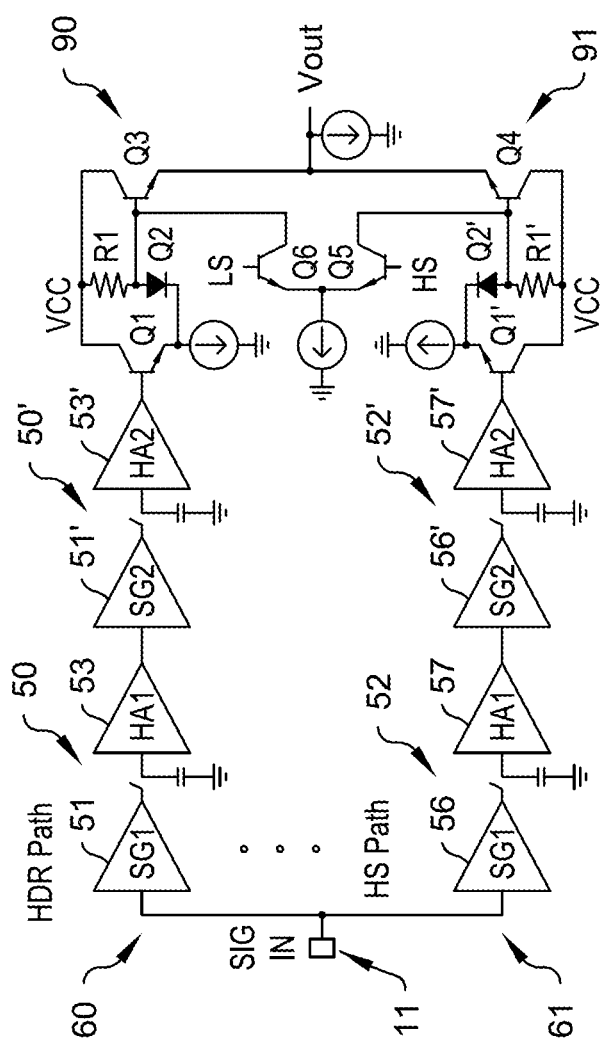

Still referring to FIG. 4b, the output of each illustrated hold amplifier 53',57' is connected to a base of a respective transistor Q1,Q1' (e.g. a BJT NPN transistor). Transistors Q1,Q1' and second diodes Q2,Q2' (which may be embodied as a diode-connected NPN transistors) define respective emitter follower arrangements. Resistors R1,R1' provide bias current for diodes Q2,Q2'. For operation of the high resolution signal path 60, transistors Q1, Q1', Q2, Q3 and Q5 will be on (high). While transistors Q2', Q4 and Q6 are off (low). The control signal LS will be low at the base of transistor Q6, and the control signal HS will be high at the base of transistor Q5. Thus, for operation in the high resolution mode, transistor Q3 acts as an emitter follower, with transistors Q1,Q2 acting an up/down emitter followers, respectively. The current in the differential pair comprising transistors Q5,Q6 pulls the voltage at the base of transistor Q4 below that of transistor Q3. This causes transistor Q3 to be on, and transistor Q4 to be off. As the current in transistor Q5 is applied to resistor R1', the base of transistor Q4 is driven low, and the diode Q2' will also be off. Similarly, for operation of the high speed signal path 61, transistors Q1, Q1', Q2', Q4 and Q6 are on (high), with transistors Q2, Q3, Q5 off (low). The control signal HS will be low at the base of transistor Q5, and the control signal LS will be high at the base of transistor Q6. Thus, for operating in the high speed mode, transistor Q4 acts as an emitter follower, with transistors Q1',Q2' acting an up/down emitter follower. The current in the differential pair comprising transistors Q5,Q6 pulls the voltage at the base of transistor Q3 below that of transistor Q4, causing transistor Q4 to be on and transistor Q3 to be off. As the current in transistor Q6 is applied to resistor R1, the base of transistor Q3 is driven low, and the diode Q2 will also be off.

The same topology for digitally programmable signal attenuation and quantizer gain is used in the second and third sampling stages or passes, as illustrated. More specifically, the second pass includes amplifier 64, buffer amplifier 65, sample and hold amplifiers 66,67, a second variable attenuator 86' for controlling the input to signal to ADC 87' and a DAC 88', and a gain controller 89' for controlling gain ADC 87'. The third and final sampling pass likewise includes amplifier 64', a buffer amplifier 65', and a variable attenuator 86" for controlling ADC 87". A third digitally programmable gain controller 89" is also provided for controlling the operation of ADC 87". As illustrated, the resolution of each of the three sampling passes can be digitally programmable, thereby providing flexibility to the converter's overall resolution.

For low resolution, low bandwidth applications, the bandwidth of all the wideband circuits must be reduced. This reduction allows noise to be reduced/minimized, as well as provides for additional settling time due to the reduced sampling rate. As discussed, it is not desirable to perform this bandwidth reduction in the critical front end high performance sample and hold circuits of the ADC. In the illustrated embodiments of FIG. 4a, bandwidth may be selectively reduced via the addition of a capacitance through for example, a semiconductor based switch illustrated as bandwidth (BW) control circuits 70,70',70". As shown in FIG. 4a, first buffer amplifier 65 of ADC 87' is a feedback amplifier, and extra compensation capacitance for its control loop can be selectively switched in to reduce the noise and bandwidth thereof. This switched in capacitor increases the settling time for the high resolution mode. After the first buffer amplifier, the performance requirements for the second and third passes of sub-ranging ADC system 80 are reduced. Thus, the capacitance of the third sample and hold circuit can be increased in a similar fashion using additional BW control circuit 70'.

In the high resolution mode of the ADC, increasing the compensation capacitor is accomplished by turning on BW control circuit 70 (e.g. a NMOS switch) for the first summing amplifier and BW control circuits 70' for the second summing amplifier. For the high resolution mode, the input bandwidth is reduced, as is the sample rate. Thus, for this mode, the bandwidth of the summing amplifier may be reduced, as a result of the increased settling time afforded to the amplifier. Additionally, a lower bandwidth reduces the root mean square (RMS) noise contribution of each summing amplifier, thereby improving the overall signal-to-noise ratio (SNR) of the overall ADC. It should be noted that it is possible to increase the compensation capacitor further for BW control circuit 70" compared to BW control circuit 70. This is due at least in part to the second summing amplifier being connected further down the chain in the sub-ranging ADC. Thus, the performance requirements for this amplifier are reduced over the requirements for the first summing amplifier. The third sample/hold performance requirements are reduced compared to the first two sample holds. By increasing the capacitance (C) of the hold capacitor, reductions in the sample/hold bandwidth and the RMS noise are realized. By way of example, increasing the capacitance by a factor of 2-4 will reduce the overall bandwidth of the sample and hold by a similar factor, as bandwidth is proportional to the value of 1/C.

Moreover, as the root-mean-square (RMS) noise of the sample and hold is proportional to $$\frac{1}{\sqrt{C}},$$

the RMS noise will reduce by a factor of 1.44-2. Additionally, nonlinear pedestal and droop are reduced as the capacitance value increases. The performance requirements of the third pass quantizer are also reduced by the cascaded gain of the first and second buffer amplifiers 65,65'.

While offering numerous performance advantages, sub-ranging ADC system 80 of FIG. 4a presents several challenges for implementing a suitable clock generation system. For example, the first clock signal $f_{phi0}$ must possess very jitter for controlling the first sample and hold amplifier pair 51,53 (or 56,57). By way of non-limiting example, for a relatively high sample rate, the amount of jitter that can be tolerated in the sampling clock signal path is on the order of tens of femtoseconds. This is because the RF front end circuit of ADC system 80 requires the lowest noise possible to prevent ADC performance hindrances (SNR, ENOB). For the first sample/hold in the signal chain, any jitter (noise) on the clock signal gets transferred to the held value. After this event, the clock jitter requirements are relaxed, as there is no further sampling of the input signal. Thus, the first clock circuit must exhibit extremely low noise. Further, timing generation requires that edge skew outputs track over, or adjusted for, process, voltage and temperature (PVT). More specifically, the ADC conversion process is based on the setting of timing edges relative to each other. If these edges drift independently of each other, then the conversion process can severely degrade. Thus, it is important that all of the clock edges generated track each other over PVT. Finally, as set forth above, the timing generation circuit needs to cover greater than a decade of frequency coverage of the input clock frequency.

In order to support the variable frequency clock needed for the ADC application of FIG. 4a, including greater than a decade of frequency coverage, alternative clocking schemes are required. Embodiments of the present disclosure include clocking schemes comprising multiple delay locked loops (DLLs), each with an octave or more of frequency coverage for providing wide bandwidth operation (e.g. 100 MHz to 2 GHz). As the system is closed-loop in nature, clock outputs will by corrected for process and temperature.

Figure 5:
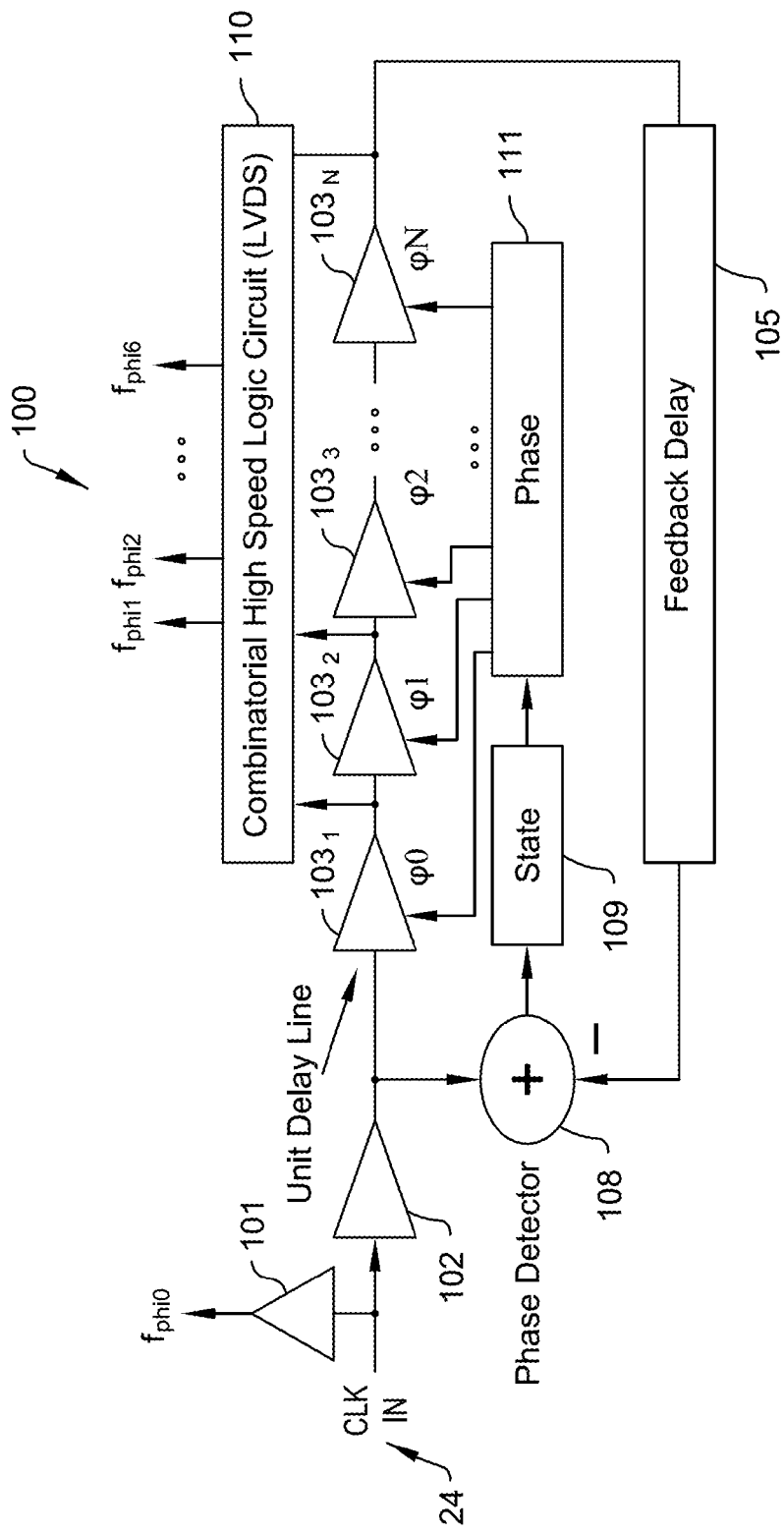
FIG. 5 is a simplified schematic diagram of a unit delay-locked loop (DLL) used in a clock generation system according to embodiments of the present disclosure.

Referring generally to FIG. 5, an exemplary single DLL 100 according to an embodiment of the present disclosure is shown. DLL 100 is responsive to an input clock signal 24 for creating the clock edges needed for all of the functions of the ADC (e.g. ADC system 80 of FIG. 4a). More specifically, an input squaring circuit 101 may be configured to perform a squaring operation on input clock signal 24, and output the result (i.e. $f_{phi0}$) to, for example, the first sample and hold circuits of the ADC (e.g. sample and hold circuits 50,52 of FIG. 4a). This approach allows for the lowest clock jitter for the first sample and hold clock signal. In this way, aperture jitter may be reduced/minimized. This is in contrast to ADC clocking schemes using the above-described timing ramps, where additional circuitry placed in-line with the input squaring circuit may cause significant increases in clock jitter.

Still referring to FIG. 5, input clock signal 24 is provided to low noise buffer amplifier 102, the output of which is provided to a chain of voltage controlled delay lines $103_1$, $103_2$, $103_3$ ... $103_N$. The output of the delay line chain is provided as an input to a phase detector 108 via a feedback delay loop 105. Phase detector 108 is configured to compare the phase of input clock signal 24 to the output phase of the delay chain of DLL 100. The output of phase detector 108 is provided to a state counter 109. As will be understood by one of ordinary skill in the art, state counter 109 is operative to determine, based on the number of delay line elements $103_1$, $103_2$, $103_3$ ... $103_N$ used in delay lock loop 100, and feedback delay loop 105, the phase output of each delay element $103_1$, $103_2$, $103_3$ ... $103_N$. In this way, state counter 109 adjusts the phase shifts for each delay line element $103_1, 103_2, 103_3 \ldots 103_N$, such that feedback delay loop 105 will be stabilized.

The digital output of state counter 109 is provided to a phase selector 111. Phase selector 111 may comprise a series of multi-bit DACs with digital inputs provided from state counter 109. Phase selector 111 is operative to output a plurality of control signals to respective delay lines $103_1, 103_2, 103_3 \ldots 103_N$ for selectively controlling the delay imparted to input clock signal 24. The resulting delayed clock signals output from each delay line $103_1, 103_2, 103_3 \ldots 103_N$ are provided to a logic circuit 110 comprising a plurality of buffer amplifiers for generating the desired remaining clock signals (e.g. $f_{phi0}$-$f_{phi6}$) for control of the subsequent sampling functions of ADC system 80 of FIG. 4a.

Figure 6:
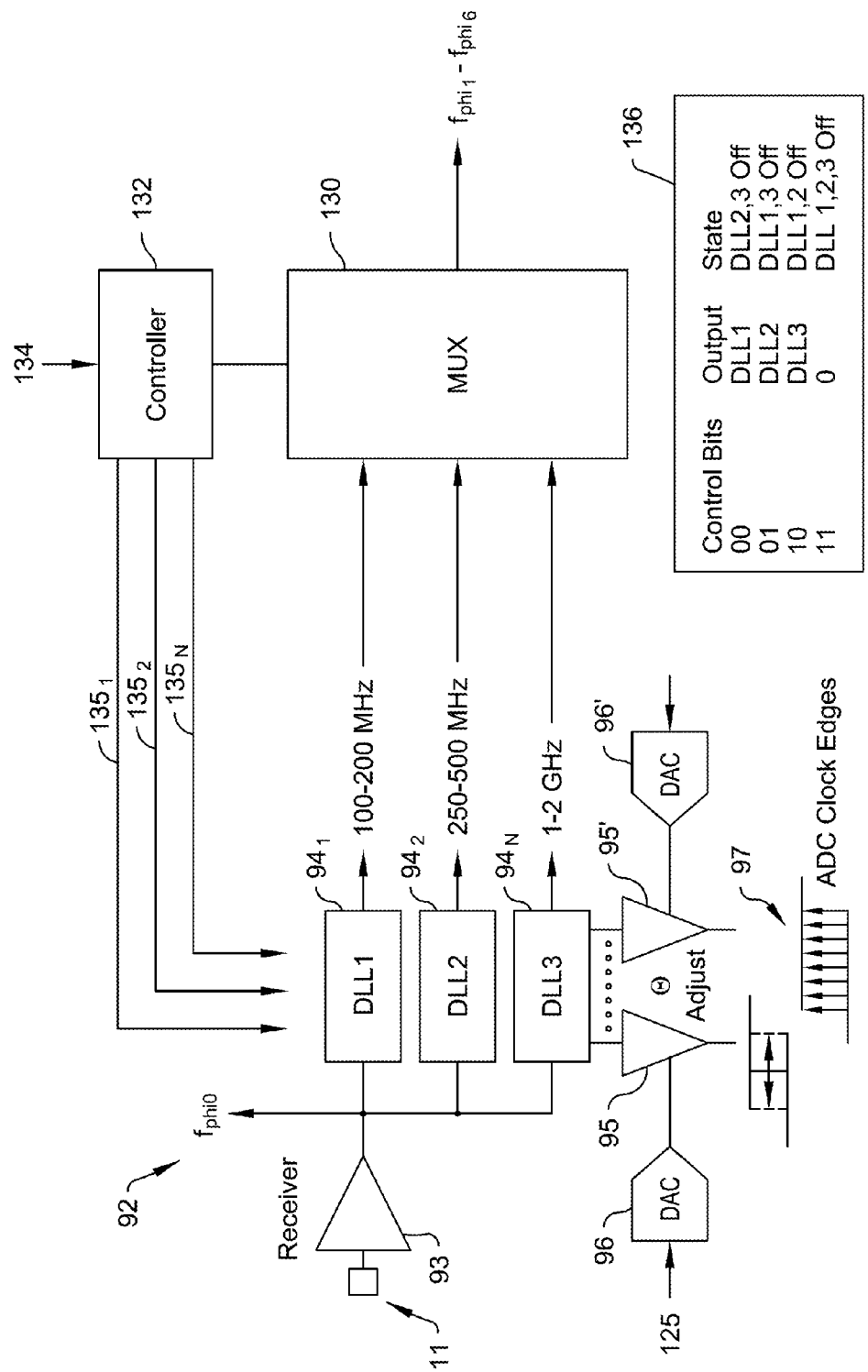
FIG. 6 is a simplified schematic diagram of a clock generation system utilizing a plurality of DLLs, as illustrated in FIG. 5, according to an embodiment of the present disclosure.

Referring generally to FIG. 6, a simplified schematic diagram of a clock generation system according to an embodiment of the present disclosure is shown. System 92 comprises a receiver 93 responsive to input clock signal 24. The received input clock signal 24 is provided to a plurality of DLLs $94_1, 94_2, 94_N$ (e.g. DLL 100 of FIG. 5). Each DLL $94_1, 94_2, 94_N$ is configured to cover a portion of the exemplary 100 MHz to 2 GHz operating frequency range of, for example, ADC system 80 of FIG. 4. In order to properly align the clocking edges of the output clock signals, during test and calibration, digitally controlled DACs 96,96' can be used to adjust the placement of each clock edge 97 output from an operating DLL via error amplifiers 95,95'.

More specifically, according to embodiments of the disclosure, clock edges 97 may be calibrated over process and temperature, and the resulting calibration data stored in look-up tables to provide for real-time correction of timing errors in order to optimize ADC performance. In the same fashion that DACs are used in phase selector 111 to adjust phase in DLL 100 disclosed FIG. 5, DACs 96,96' may be used to adjust phase in the embodiment of FIG. 6. In this way, the DLL of FIG. 5 can be considered as a coarse phase adjustment device, and DACs 96,96' of FIG. 6 can be considered as fine phase adjustment devices.

Still referring to FIG. 6, embodiments of the present disclosure include a DLL selection circuit including a multiplexer 130 and a DLL controller 132 configured to provide for the selective activation and/or deactivation of each DLL $94_1, 94_2, 94_N$. Specifically, DLL controller 132 may be responsive to an input control signal 134 for selectively activating one (or more) of DLLs $94_1, 94_2, 94_N$ via one or more control signals $135_{1-N}$. DLL controller 132 is further configured to operate multiplexer 130 according to the received control signal 134 for outputting the plurality of clock signals (e.g. $f_{phi1}$-$f_{phi6}$) generated by the activated or selected DLL $94_1, 94_2, 94_N$. More specifically, multiplexer 130 may be configured to control the sampling rate to the ADC as well as the associated output clock edges for that sample rate. DLL controller 132 provides a control signal to multiplexer 130 indicative of a clock frequency range to select (e.g. one of the exemplary 3 frequency ranges). Based on this control signal multiplexer 130 is configured to select the output ADC clock frequency, associated ADC clock edges, and the associated amplitude of those clock edges. The pulse width of each ADC clock signal, for a given sample rate, is determined within each DLL $94_1, 94_2, 94_N$. Exemplary control logic 136 is shown for selectively activating a DLL according to a desired clock frequency range.

Figure 7:
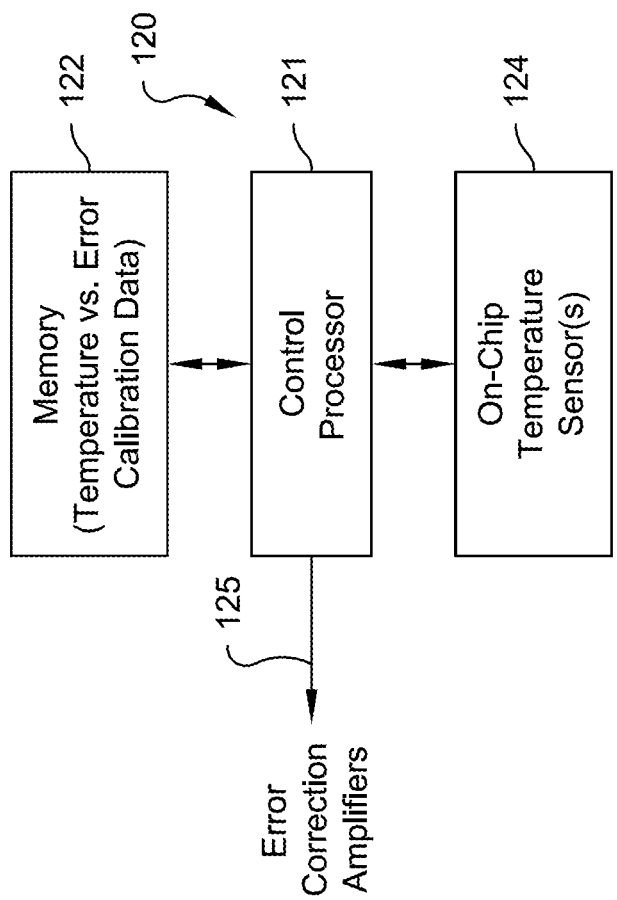
FIG. 7 is a simplified schematic diagram of a clock edge control system for controlling DACs shown in FIG. 6 according to an embodiment of the present disclosure.

Referring generally to FIG. 7, a clock edge control circuit or system 120 for controlling DACs 96,96' of FIG. 6 is provided. System 120 may include a control processor 121 and a memory device 122 (e.g. EEROM). Memory device 122 may be used to store calibration data thereon, including pre-measured temperature calibration data associating a measured on-chip ADC temperature with a measured clock signal edge error or drift (i.e. a phase error). This calibration data may be stored in the form of a look-up table (e.g. a look-up table correlating clock edge position or change therein to measured temperature) for each individual DAC 96,96'. In an alternate embodiment, a curve fitting function may be implemented by control processor 121, and the appropriate edge placements digitally calculated for improved resolution with respect to temperature change.

One or more temperature sensors 124, such as temperature-sensing diodes, may be provided for continuously monitoring the temperature of the ADC or local junction temperature of a die in the vicinity of the DLLs. Temperature measurements may be taken periodically via processor 121, can be used to adjust timing edges in real-time based on changes in temperature during normal operation using the values in the table look-up. Processor 121 may be configured to receive a real-time ADC temperature via temperature sensor 124, and associate the measured temperature with a known timing error stored on memory device 122. Processor 121 may be operative to provide one or more timing correction signals 125 based on the results of the comparison between measured temperature and the stored calibration data to DACs 96,96' for correcting a known timing error or drift via amplifiers 95,95'. It should be understood that amplifiers 95,95' provide for phase adjustment, thereby adjusting the edges of the clock waveforms. In one embodiment, DACs 96,96', error amplifiers 95,95', and control processor 121 and memory device 122 may be incorporated into logic circuit 110 of FIG. 5. In other embodiments, these components may be embodied as one or more separate circuits.

Multiple methods may be employed to reconfigure the programmable sub-ranging ADCs described herein according to desired speed, power, resolution and noise requirements. This flexibility is generally achieved by implementing digital programmability into select components of the ADC, enabling a single ADC architecture to be used in many different applications. According to embodiments of the present disclosure, the DC current supplied to each converter element, the number of sub-ranging stages, the number of quantizer and DAC bits, the quantizer Q level and the DAC least significant bit (LSB) current level all may be programmable. This is in contrast to converters in the current commercial marketplace, which have no such capability to be reconfigured.

Figure 8A:
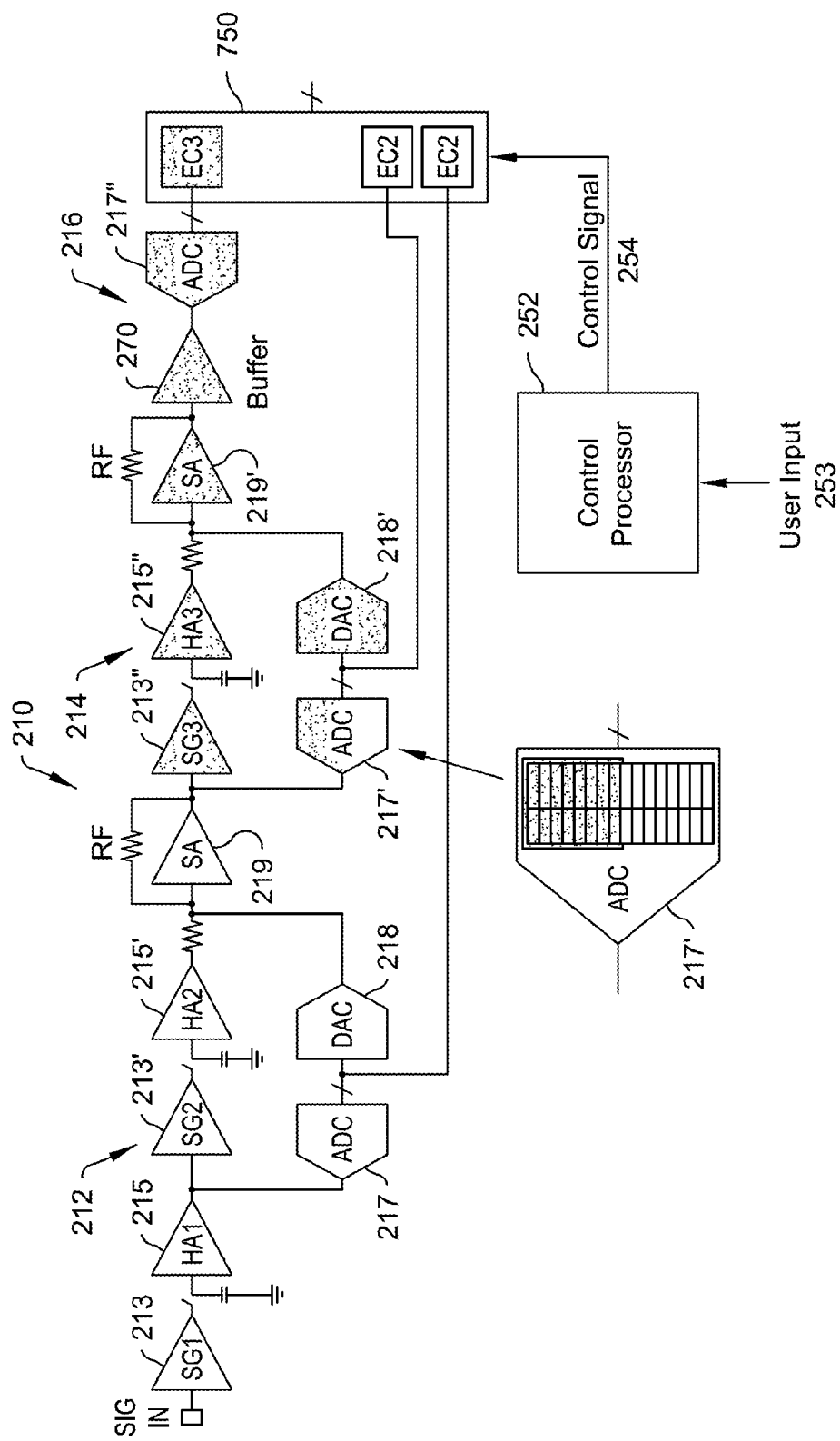
FIG. 8a is a simplified schematic diagram of a reconfigurable sub-ranging ADC according to an embodiment of the present disclosure.
Figure 8B:
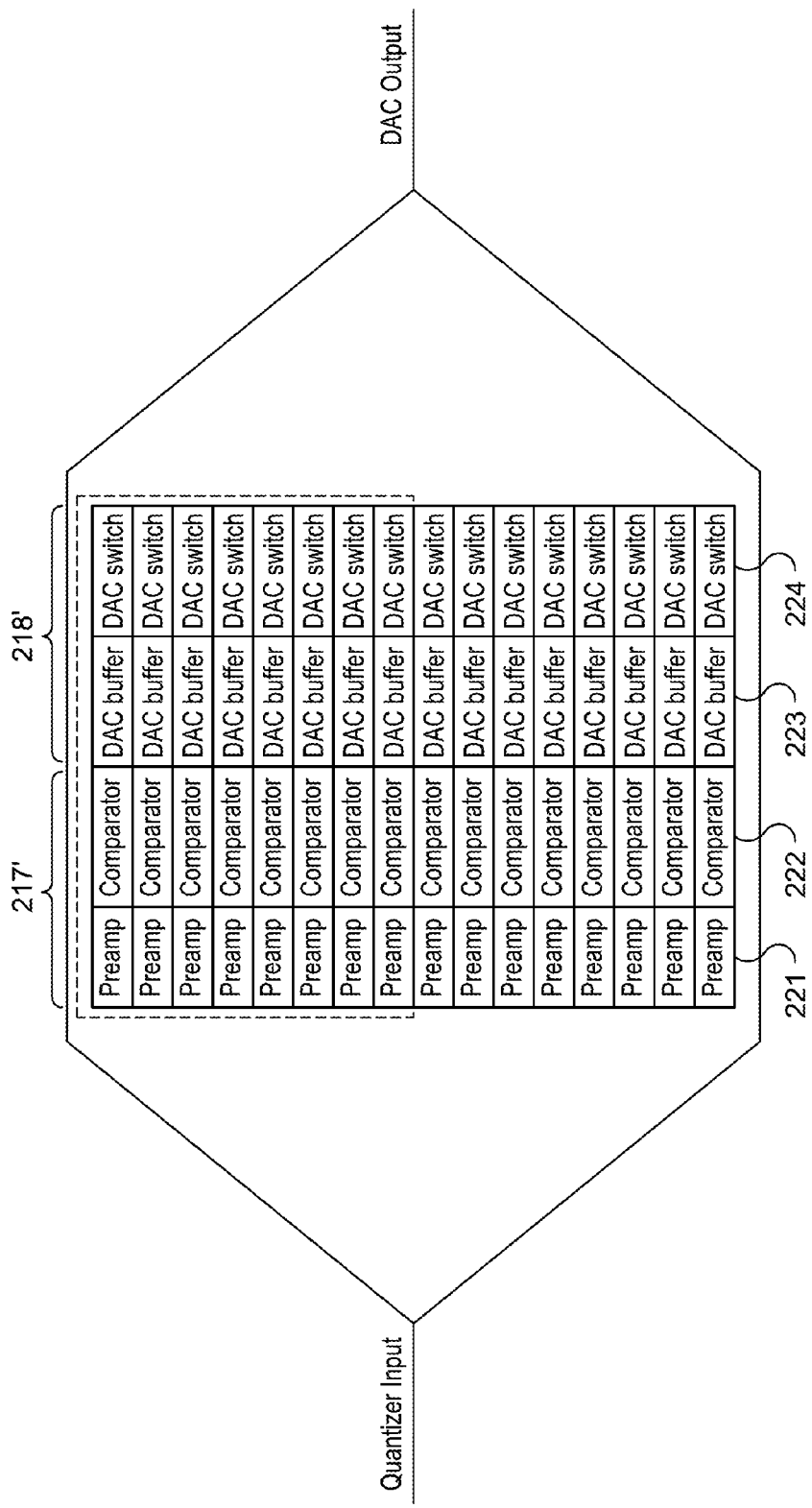

FIGS. 8a and 8b illustrate an exemplary system and method for reconfiguring a sub-ranging ADC having a topology similar to that shown and described with respect to FIG. 1. Sub-ranging ADC 210 comprises buffer and hold amplifiers (sampling gates) 213-213", (hold amplifiers) 215-215", summing amplifiers 219,219', ADCs 217,217' and corresponding DACs 218,218' making up respective first and second stages 212,214. Third stage 216 consists of a buffer amplifier 270 and ADC 217". A digital error correction processor 250 is provided, and operates in substantially the same manner as described above with respect to error correction processor 25 of FIG. 1. Moreover, according to an embodiment of the present disclosure, a control processor 252 is provided, and is operative to reconfigure ADC 210 according to any desired performance characteristic. More specifically, ADC 210 may be configured to generate control signals for selectively activating and deactivating elements of first, second and third stages 212,214,216 in response to, for example, a user input 253.

In the exemplary illustrated configuration, a control signal 254 from control processor 252 may be used to reconfigure the digital error correction logic utilized by error correction processor 250, as well as deactivate amplifiers 213",215", 219', ADC 217", DAC 218' and all or part of ADC 217', such that only first stage 212 and second stage 214 are operative, while third stage 216 is bypassed. As illustrated in more detail in FIG. 8b, by way of example only, in response to a control signal generated from control processor 252, half of preamplifiers 221 and comparators 222 making up ADC 217' may be selectively deactivated, as well as a corresponding number of buffer amplifiers 223 and DAC switches 224 making up DAC 218'. While one exemplary reconfiguration is shown, it should be understood that embodiments of the present disclosure may operate to selectively activate and deactivate any number and combination of components making up each and any of the ADCs and DACs of a sub-ranging ADC, and for altering the Q value and resultant resolution thereof. For example, the illustrated three stage sub-ranging ADC 210 can be reduced to either one or two stages through the above-described operations. Each of the DACs can also be reconfigured in the same way as the ADCs. More specifically, the DAC's LSB current can be programmed in the same way as the ADC's Q value.

Figure 9:
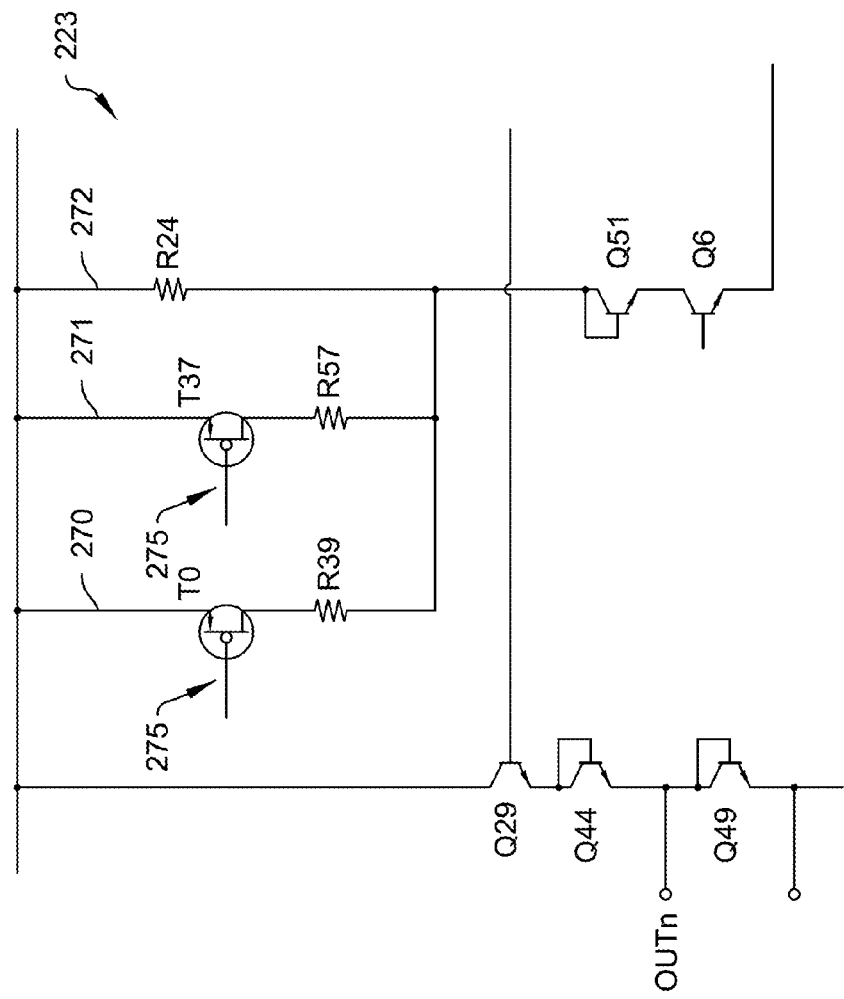
FIG. 9 is a simplified schematic diagram of a reconfigurable DAC buffer according to an embodiment of the present disclosure.
Figure 10:
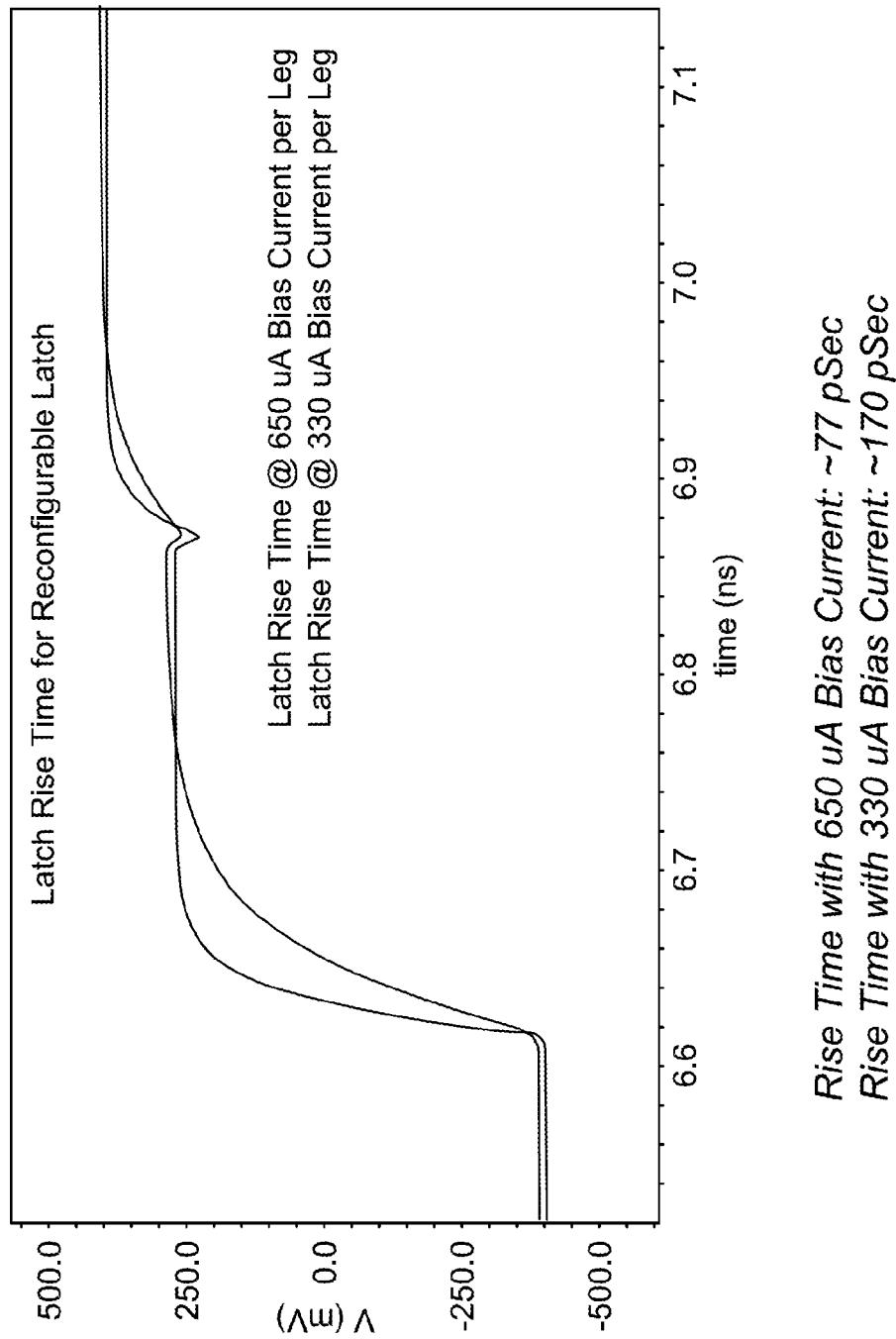
FIG. 10 is a graphical illustration of the operation of a reconfigurable ADC according to an embodiment of the present disclosure.

In order to raise or lower the power in the preamplifiers and comparators of the ADC and the DAC buffers, the bias current of these individual circuits must also be digitally programmable. However, the preamplifiers and comparators of the ADCs (e.g. preamplifiers 221 and comparators 222), as well as the buffer amplifiers (e.g. buffers 223) of the DACs, comprise resistive loads. Accordingly, as current in each of these circuits is reduced, for example, its output voltage, and output voltage swing, is also reduced. This voltage swing reduction can negatively impact the performance of the ADC. Referring generally to FIG. 9, an exemplary circuit is shown for holding the output voltage swing of an exemplary DAC buffer 223 (e.g. a DAC buffer amplifier of DAC 218' in FIG. 8a) constant, while the bias current in the cell is reduced, by altering the value of an internal resistive load according to a change in the input current. As illustrated, DAC buffer 223 includes parallel nodes 270,271,272 having respective resistors R39, R57,R24. A nominal resistance provided by resistor R24 can be reduced via the addition of resistors R39 and R57 by selectively activating transistors T0 and T37. In this way, the total resistive load of DAC buffer 223 can be altered in order to track changes in input current, and the output voltage will remain constant. More specifically, is transistors T0 and T37 are on or active, the load resistance consists of a parallel combination of resistors R24, R39, and R57. This would correspond to the maximum bias current for DAC buffer 223. If the buffer bias current is now digitally reduced, the load resistance must correspondingly increase. For example, transistor T0 can be turned off, and now the load resistance becomes resistor R24 in parallel with resistor R57. If the bias current for DAC buffer 223 is digitally reduced further, transistor T37 is turned off, and the value of the load resistances becomes resistor R24. At each step of bias adjustment, the load resistance value is correspondingly increased, such that the output voltage swing will remain the same. Thus, the exemplary DAC buffer 223 provides three possible digitally programmable bias currents, and three corresponding digitally programmable load resistor values. This topology may be implemented into any of the components of the sub-ranging ADC shown that utilize resistive loads and differential pairs, including the preamplifiers and comparators of the ADCs, as well as the buffer amplifiers of the DACs. For example, FIG. 10 illustrates exemplary simulation results for the application of the above-described variable resistance/variable bias current topology implemented into a latch of a comparator (e.g. comparator 222 of FIG. 8b). As an input current is reduced, and the load resistance is increased, and the rise (and fall time) of the comparator increases. Resultantly, the ADC power can be reduced digitally, while maintaining consistent signal swings in the signal path.

Figures 11A, 11B:
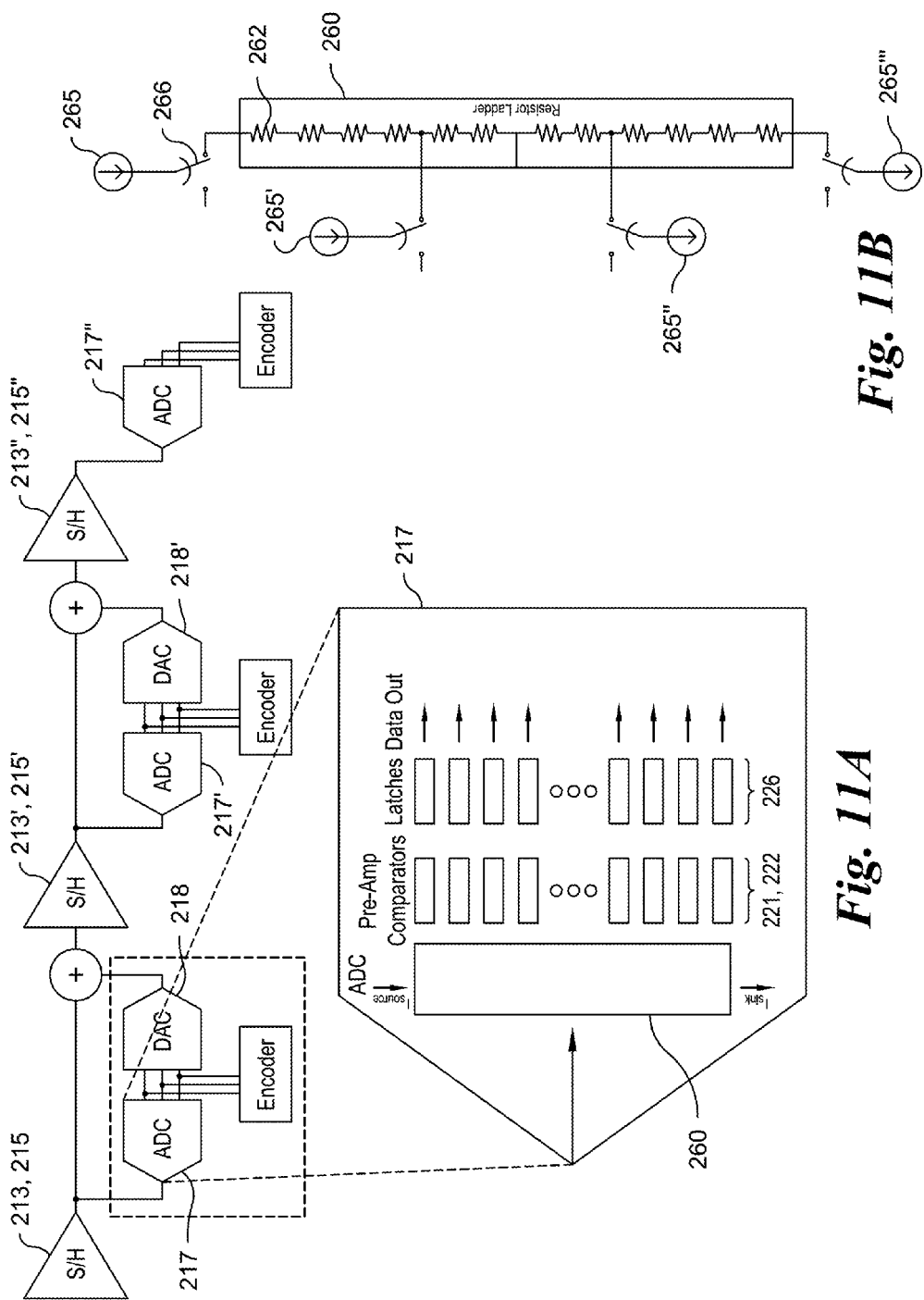
FIGS. 11a and 11b are simplified schematic diagrams of a reconfigurable ADC according to an embodiment of the present disclosure.

FIGS. 11a and 11b illustrate additional circuitry of an exemplary reconfigurable ADC or quantizer 217 according to an embodiment of the present disclosure. ADC 217 includes a resistive ladder 260 comprising a plurality of resistors 262. The quantizer Q level is set by the current supplied by a plurality of current sources 265,265',265",265'" into the resistor 262 (Q=I*R). Accordingly, the resolution and the Q level of ADC 217 may be digitally programmable by adjusting the currents supplied these current sources. In order to adjust the resolution while adjusting the Q value, a plurality of current sources 265,265',265",265'" and associated switches 266 are provided for selectively supplying current to resistive ladder 260. By way of example only, for full resolution and Q level operation of ADC 217, current sources 265 and 265'" may be turned on and current sources 265' and 265" turned off via, for example, a control signal provided by control processor 252 of FIG. 8a to respective switches 266. Resultantly, each of the associated pre-amplifiers, comparators, DAC buffers and DAC switches are powered on. In one implementation, to alter the ADC resolution and the Q level, current sources 265 and 265'" may be turned off and current sources 265' and 265" turned on via respective switches 266. This arrangement results in only a portion of the pre-amplifiers, comparators, DAC buffers and DAC switches being powered on, with a remaining portion turned off. While FIG. 11b illustrates two sets of current sources that can be used, additional sets of current sources and associated switches can be added beyond what is shown to provide additional programmability. For example, a switchable current source may be provided between each resistor 262 of resistive ladder 260, providing for individual control of each of the pre-amplifiers, comparators, DAC buffers, and DAC switches.

Figure 12:
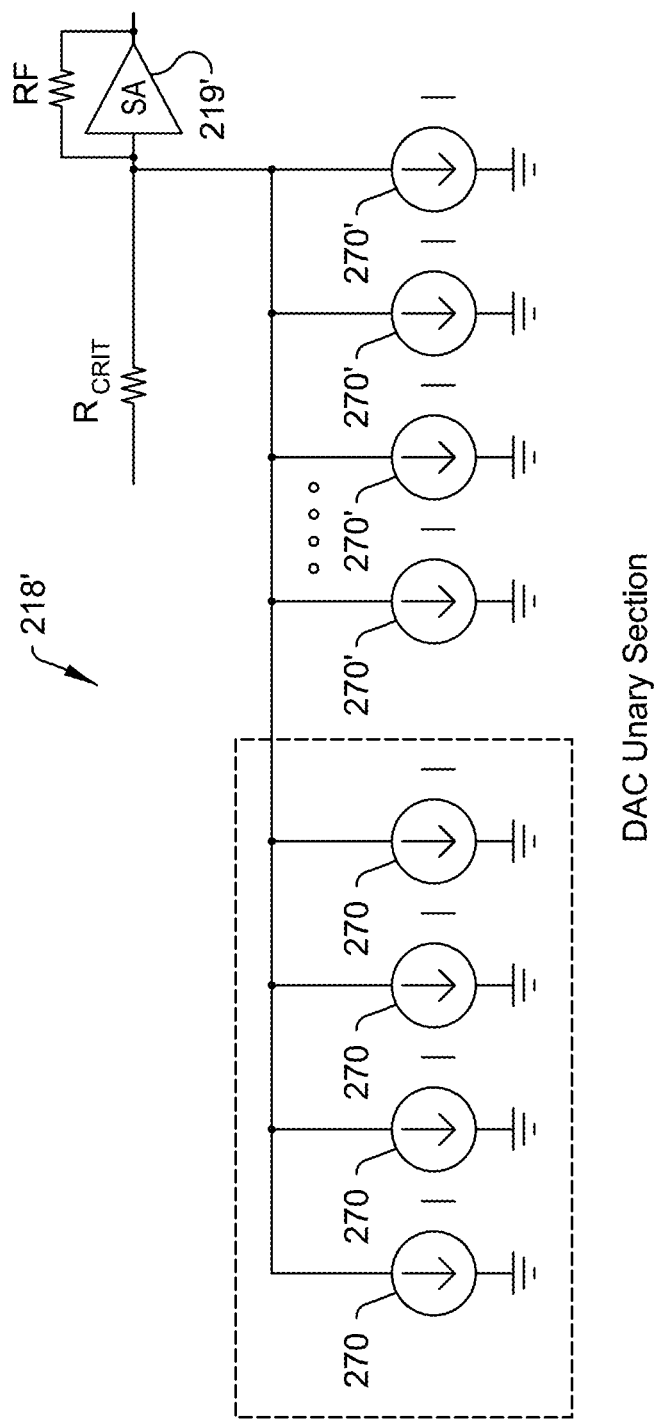
FIG. 12 is a simplified schematic diagram of a reconfigurable DAC according to an embodiment of the present disclosure.

FIG. 12 illustrates an exemplary reconfigurable DAC 218' according to an embodiment of the present disclosure. The illustrated DAC structure is unary, in which each of current sources 270,270' have the same current value I. When an ADC is reconfigured as described above with respect to FIGS. 11a and 11b, the DAC also must be reconfigured accordingly. A portion of the current sources 270 can be turned off (e.g. via one or more switching elements responsive to one or more controls signal received from control processor 252 of FIG. 8a), as an example, when associated pre-amplifiers and comparators are shut down in the ADC. The remaining current sources 270' are maintained in an active state. In this way, the gain of DAC 218', or equivalently the value of the current I, is also digitally programmable.

While these systems and methods for reconfiguring a sub-ranging ADC have been shown and described as applied to the simplified sub-ranging ADC of FIG. 8a and its components, it should be understood that these systems and methods may be applied to any of the above-described embodiments of sub-ranging ADCs (e.g. those described with respect to FIGS. 3-7), as well as to any other type or topology or ADC without departing from the scope of the present invention.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A reconfigurable wideband analog-to-digital converter (ADC) system comprising:
   a first converter stage including:
      a first signal path including a first sample and hold circuit for sampling an input signal at a first resolution;
      a second signal path arranged in parallel with the first signal path, the second signal path including a second sample and hold circuit for sampling the input signal at a second resolution;
   a second converter stage including at least one sample and hold circuit arranged in series with an output of at least one of the first or second sample and hold circuits;
   a first ADC arranged in parallel with the second converter stage and configured to generate a digital representation of the sampled input signal from the first or second sample and hold circuit; and
   a control circuit arranged in parallel with the second converter stage and between outputs of the first and second sample and hold circuits and an input of the first ADC and configured to selectively provide the sampled input signals generated by the first or second sample and hold circuit to the input of the first ADC.

2. The system of claim 1, wherein the second converter stage comprises:
   a third sample and hold circuit arranged in series with the first sample and hold circuit; and
   a fourth sample and hold circuit arranged in series with the second sample and hold circuit.

3. The system of claim 2, further comprising a second ADC responsive to a signal sampled by one of the third or forth sample and hold circuits.

4. The system of claim 3, further comprising a third converter stage including a fifth sample and hold circuit in series with the output of one of the third or fourth sample and hold circuits; and
   a third ADC responsive to a signal sampled by the fifth sample and hold circuit.

5. The system of claim 4, further comprising at least one bandwidth control circuit for altering the bandwidth of at least one of the second or third converter stages.

6. The system of claim 4, further comprising an error correction processor responsive to outputs of the first, second and third ADCs for generating a digital output representative of the input signal.

7. The system of claim 6, further comprising:
   a first digital-to-analog converter (DAC) responsive to the output of the first ADC; and
   a second DAC responsive to the output of the second ADC.

8. The system of claim 7, further comprising a control processor configured to generate a plurality of control signals for selectively activating and deactivating at least one of the first, second or third converter stages.

9. The system of claim 8, wherein the control processor is further configured to generate a control signal for reconfiguring the error correction processor according to an activation state of the first, second or third converter stages.

10. The system of claim 8, wherein the control processor is further configured to selectively activate and deactivate at least one of the first, second or third ADCs.

11. The system of claim 10, wherein the control processor is further configured to selectively activate and deactivate at least one of the first or second DACs.

12. The system of claim 11, wherein at least one of the first, second or third ADCs comprises a plurality of input current sources, wherein one or more of the current sources are arranged in series with a switching element for selectively supplying current to the at least one ADC in response to a control signal.

13. The system of claim 11, wherein at least one of the first, second or third ADCs comprises:
   a plurality of resistive elements arranged in parallel defining a resistive load; and
   at least one switching element arranged in series with at least one of the resistive elements for selectively altering a resistance of the resistive load in response to a control signal.

14. The system of claim 11, wherein at least one of the first, second or third DACs comprises:
   a plurality of resistive elements arranged in parallel defining a resistive load; and
   at least one switching element arranged in series with at least one of the resistive elements for selectively altering a resistance of resistive load in response to a control signal.

15. The system of claim 11, wherein at least one of the first, second or third DACs comprises a plurality of input current sources, wherein one or more of the current sources may be selectively activated in response to a control signal for altering the least significant bit (LSB) current level of the DAC.

16. A reconfigurable wideband analog-to-digital converter (ADC) system comprising:
   a first converter stage including:
      a first signal path including a first sample and hold circuit for sampling an input signal at a first resolution;
      a second signal path arranged in parallel with the first signal path, the second signal path including a second sample and hold circuit for sampling the input signal at a second resolution;
   a first ADC configured to generate a digital representation of the sampled input signal from the first or second sample and hold circuit;
   a control circuit arranged between outputs of the first and second sample and hold circuits and an input of the first ADC and configured to selectively provide the sampled input signals generated by the first or second sample and hold circuit to the input of the first ADC, and a first variable attenuator arranged between an output of the control circuit and the input of the first ADC.

17. The system of claim 16, further comprising a second converter stage including at least one sample and hold circuit arranged in series with an output of at least one of the first or second sample and hold circuits;
   wherein the control circuit and the first ADC are arranged parallel with the second converter stage.

18. The system of claim 16, further comprising a second variable attenuator arranged between the outputs of the third and fourth sample and hold circuits and an input of the second ADC.

19. The system of claim 18, further comprising a third variable attenuator arranged between the output of the fifth sample and hold circuit and an input of the third ADC.

20. A reconfigurable analog-to-digital converter (ADC) system comprising:
   a first converter stage including a first sample and hold circuit for sampling an input signal at a first resolution and a second sample and hold circuit arranged in parallel with the first sample and hold circuit for sampling the input signal at a second resolution;
   a second converter stage including a third sample and hold circuit arranged in series with the first converter stage;
   a third converter stage including a fourth sample and hold circuit arranged in series with the first and second converter stages;
   a first ADC arranged in parallel with the second converter stage and configured to generate a digital representation of the input signals sampled by the first converter stage; and
   a control circuit configured to selectively provide the input signal sampled by the first or second sample and hold circuit to an input of the first ADC;
   wherein the control circuit is arranged in parallel with a primary signal path of the converter defined between an input of the first converter stage and an output of the third converter stage.

* * * * *